US009999858B2

(12) United States Patent
Baumgart et al.

(10) Patent No.: US 9,999,858 B2
(45) Date of Patent: Jun. 19, 2018

(54) METHOD FOR MAKING MULTIPLE WALLED NESTED COAXIAL NANOSTRUCTURES

(71) Applicant: Old Dominion University Research Foundation, Norfolk, VA (US)

(72) Inventors: Helmut Baumgart, Yorktown, VA (US); Gon Namkoong, Yorktown, VA (US); Diefeng Gu, Newport News, VA (US); Tarek Abdel-Fattah, Yorktown, VA (US)

(73) Assignee: OLD DOMINION UNIVERSITY RESEARCH FOUNDATION, Norfolk, VA (US)

( * ) Notice: Subject to any disclaimer, the term of this patent is extended or adjusted under 35 U.S.C. 154(b) by 767 days.

(21) Appl. No.: 14/540,359

(22) Filed: Nov. 13, 2014

(65) Prior Publication Data

US 2015/0136733 A1 May 21, 2015

Related U.S. Application Data

(63) Continuation of application No. 13/265,427, filed as application No. PCT/US2010/032306 on Apr. 23, 2010, now abandoned.

(60) Provisional application No. 61/172,632, filed on Apr. 24, 2009.

(51) Int. Cl.
| | |
|---|---|
| C23C 16/40 | (2006.01) |
| B01D 61/42 | (2006.01) |
| B01D 67/00 | (2006.01) |
| B01D 69/02 | (2006.01) |
| B01D 71/02 | (2006.01) |
| C23C 16/01 | (2006.01) |
| F04B 19/00 | (2006.01) |

(52) U.S. Cl.
CPC ....... *B01D 61/427* (2013.01); *B01D 67/0062* (2013.01); *B01D 67/0072* (2013.01); *B01D 69/02* (2013.01); *B01D 71/02* (2013.01); *B01D 71/022* (2013.01); *B01D 71/024* (2013.01); *C23C 16/01* (2013.01); *C23C 16/403* (2013.01); *F04B 19/006* (2013.01); *B01D 2313/345* (2013.01); *B01D 2325/08* (2013.01)

(58) Field of Classification Search
CPC . C23C 16/45525; C23C 16/40; C23C 16/403; C23C 16/407
See application file for complete search history.

(56) References Cited

U.S. PATENT DOCUMENTS

| | | |
|---|---|---|
| 7,339,184 B2 | 3/2008 | Romano et al. |
| 8,334,241 B2 | 12/2012 | Sakaguchi |
| 2007/0100086 A1* | 5/2007 | Hong .................. B82Y 30/00 525/416 |
| 2007/0107103 A1* | 5/2007 | Kempa ................ B82Y 20/00 136/243 |
| 2008/0246076 A1* | 10/2008 | Chen .................. H01L 21/0337 257/316 |
| 2008/0299208 A1* | 12/2008 | Wendorff ............. B82Y 5/00 424/490 |
| 2008/0300331 A1 | 12/2008 | Schellenberg et al. |
| 2009/0137043 A1* | 5/2009 | Parsons .................. C23C 16/01 435/398 |
| 2014/0015548 A1* | 1/2014 | Naughton ............. G01R 27/26 324/658 |
| 2014/0054475 A1* | 2/2014 | Khajavikhan ......... H01S 5/30 250/552 |

OTHER PUBLICATIONS

Peng, Qing, et al., "Bi-directional Kirkendall Effect in Coaxial Microtube Nanolaminate Assemblies Fabricated by Atomic Layer Deposition". ACS NANO, vol. 3, No. 3 pp. 546-554.*
Hwang, Joowon, et al., "Al2O3 Nanotubes Fabricated by Wet Etching of ZnO/Al2O3 Core/Shell Nanofibers". Advanced Materials, 2004, 16, No. 5, Mar. 5, pp. 422-425.*
Loh, Pui Yee, et al., "Coaxial hetero-nanostructures with controllable shell thickness: a "Pore Widening" method." RSC Advances, 2014, 4, 8735-8740.*
Carny, Ohad, et al., "Fabrication of Coaxial Metal Nanocables Using a Self-Assembled Peptide Nanotube Scaffold". NanoLetters, 2006, vol. 6, No. 8, 1594-1597.*
Zhu, Jinfeng, et al., "Simulation of Field Emission Micro-Triode Based on Coaxial Nanostructure". J. Infrared Milli Terahz Waves (2009) 30: 94-102.*
Shelimov, Konstantin B., et al., "Composite Nanostructures Based on Template-Grown Boron Nitride Nanotubes". Chem. Mater. 2000, 12, 250-254.*
Peng, Quing. et al., Bi-directional Kirkendall effect in coaxial microtube nanolaminated assemblies fabricated by atomic layer deposition. ACS Nano, Feb. 17, 2009, vol. 3, No. 3, pp. 546-554.
Qin, Yong. et al., General assembly method for linear metal nanoparticle chains embedded in nanotubes. Nano Letters, Sep. 5, 2008, vol. 8, No. 10, pp. 3221-3225.
Sun, Yugang et al.; Mutiple-walled nanotubes made of metals; Advanced Materials, Feb. 3, 2004, vol. 16, No. 3; pp. 264-268.
Zhu, Zhenping et al.; Supermolecular Self-Assembly of Graphene Sheets: Formation of Tube-in-Tube Nanostructures; Nano Letters Sep. 23, 2004, vol. 4, No. 11; pp. 2255-2259.

(Continued)

*Primary Examiner* — Bret P Chen
(74) *Attorney, Agent, or Firm* — Nixon Peabody LLP; Eduardo J. Quinones

(57) ABSTRACT

Methods for making multiple walled nested coaxial nanostructures and devices incorporating the coaxial nanostructures are disclosed. The coaxial nanostructures include an inner nanostructure, a first outer nanotube disposed around the inner nanostructure, and a first annular channel between the inner nanostructure and the first outer nanotube. The coaxial nanostructures have extremely high aspect ratios, ranging from about 5 to about 1,200, or about 300 to about 1200.

15 Claims, 14 Drawing Sheets

(56) References Cited

OTHER PUBLICATIONS

International Search Report and Written Opinion; PCT/US2010/032306, dated Mar. 31, 2011.

* cited by examiner (A)           (B)

FIG. 8 TUBE-IN-TUBE STRUCTURE AFTER ETCHING $Al_2O_3$ LAYER IN BETWEEN $ZrO_2$ AND ZnO LAYER AND AAO TEMPLATE.

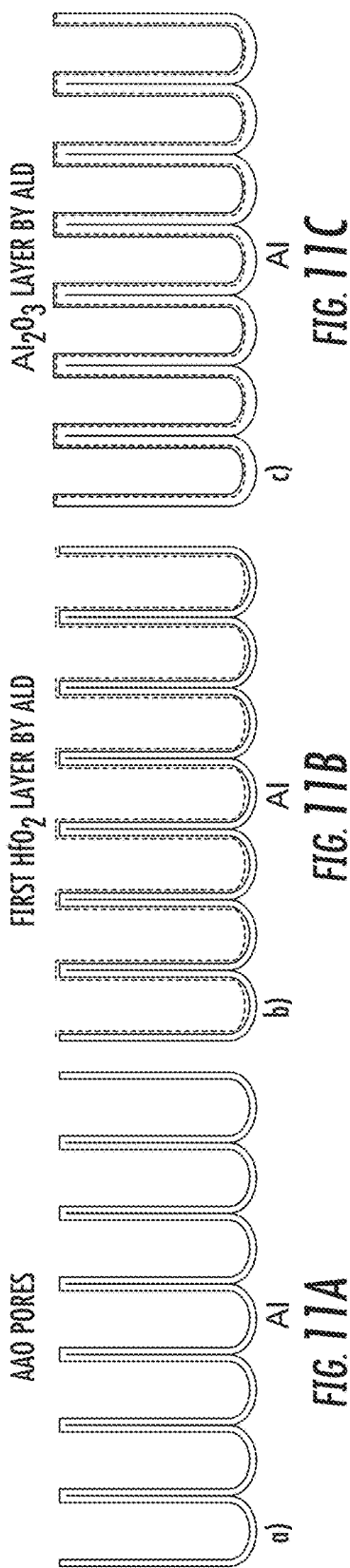

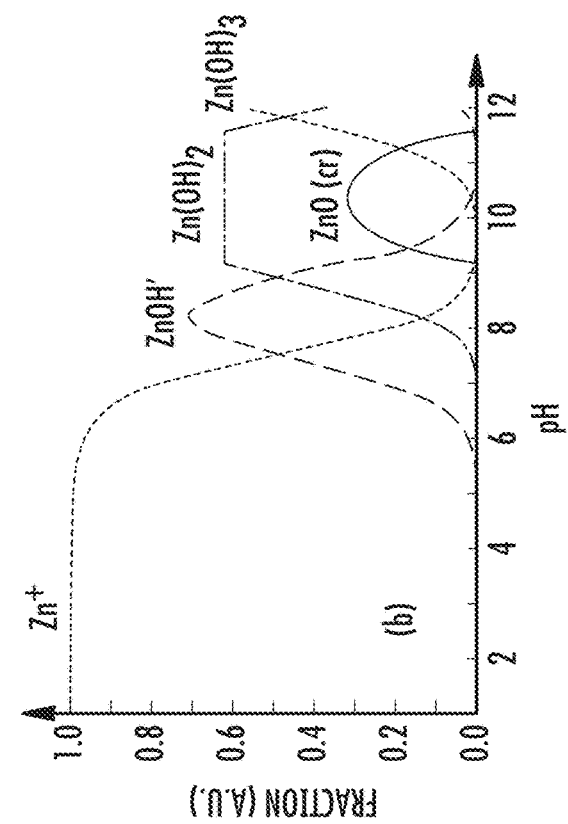
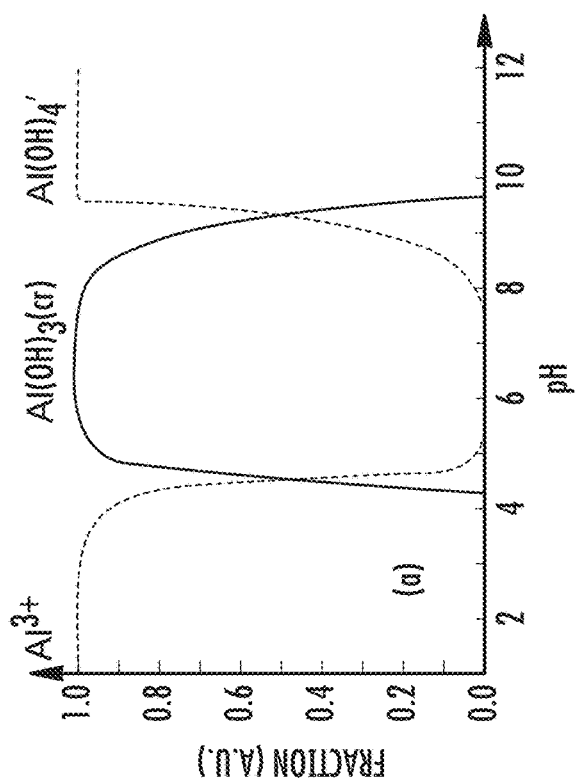
FIG. 13B
FIG. 13A

METHOD FOR MAKING MULTIPLE WALLED NESTED COAXIAL NANOSTRUCTURES

CROSS REFERENCE TO RELATED APPLICATIONS

This application is a continuation of U.S. National Stage application Ser. No. 13/265,427, filed Oct. 20, 2011 (now abandoned), which is a § 371 national phase entry of International Application No. PCT/US2010/32306, filed Apr. 23, 2010, which claims priority to U.S. Provisional Patent Application No. 61/172,632, filed Apr. 24, 2009, all of which are hereby incorporated by reference.

BACKGROUND

Nanostructures, including nanotubes, exhibit novel physical properties and play an important role in fundamental research. In addition, nanostructures and nanotubes find many practical applications because of their restricted size and high surface area. See R. Kelsall et al., *Nanoscale Science and Technology*, Wiley, Chichester, (2006); C. R. Martin, *Ace. Chem. Mater*. 28, 61 (1995); J. Goldberger et al., *Nature*, 422 599 (2003); and S. B. Lee et al., *Science*, 296, 2198 (2002). Nanotubes may be formed from a variety of materials, including different classes of materials such as insulators, semiconductors, and metals, including transition metal oxides. In particular, hafnium oxide (hafnia, $HfO_2$), aluminum oxide (alumina, $AlO_3$), titanium oxide ($TiO_2$) and zirconium oxide (zirconia, $ZrO_2$) are important materials widely used in ceramics, chemical sensors, catalysts, optoelectronics, and as high-k dielectrics in microelectronics. The semiconductor, zinc oxide (ZnO), is also used in chemical sensors. However, a need exists for nanotubes formed from metal oxides and other materials that have more complex structures, higher aspect ratios, and higher surface areas.

SUMMARY

Provided herein are multiple walled nested coaxial nanostructures, methods for making the multiple walled nested coaxial nanostructures, and devices incorporating the multiple walled nested coaxial nanostructures. The disclosed multiple walled nested coaxial nanostructures have extremely high aspect ratios and surface areas. Consequently, devices incorporating these multiple walled nested coaxial nanostructures exhibit superior and novel properties as compared with conventional devices. These advantages are further discussed below with respect to specific devices incorporating the coaxial nanostructures. The disclosed multiple walled nested coaxial nanostructures may be formed using atomic layer deposition (ALD) or other suitable chemical vapor deposition (CVD) techniques to deposit different materials by coating the inner walls of the pores of various nanoporous substrates (also referred to herein as nanoporous templates or nanoporous membranes), one atomic layer at a time. Nanoporous substrates or templates may be formed from nanoporous alumina, polycarbonate membranes, porous silicon, or any other suitable porous substrate. The ability to achieve multiple walled nested coaxial nanostructures with such high aspect ratios is derived, in part, from the use of long ALD deposition dwell times and the use of sacrificial spacer layer technology to open up all surfaces of such multiple walled nested coaxial nanostructures. The use of long ALD deposition dwell times is contrary to conventional wisdom, since longer ALD deposition times can clog the pores of the underlying porous substrates.

In one aspect, multiple walled nested coaxial nanostructures are provided. In one embodiment, the multiple walled nested coaxial nanostructure may include an inner nanostructure, a first outer nanotube disposed around the inner nanostructure, and a first annular channel between the inner nanostructure and the first outer nanotube. In another embodiment, the coaxial nanostructure may further include a second outer nanotube disposed around the first outer nanotube and a second annular channel between the first outer nanotube and the second outer nanotube. In other embodiments, a third outer nanotube may be disposed around the second outer nanotube, a fourth outer nanotube may be disposed around the third outer nanotube, and so forth, up to an $n^{th}$ outer nanotube. The aspect ratio of the coaxial nanostructures may range from about 5 to about 1,200, or about 300 to about 1200, although other aspect ratios are possible.

The materials used to form the inner nanostructure and the outer nanotubes may vary and may include a conductor, an insulator, or a semiconductor. Specific examples of conductors, insulators, and semiconductors are provided herein. A sacrificial spacer material, including $Al_2O_3$, may be disposed within the annular channel of any of the coaxial nanostructures in order to create annular channels to open up all surfaces (inner and outer wall) of these multiple walled nested coaxial nanostructures.

The multiple walled nested coaxial nanostructures may be coupled to other components, including various substrates. In some embodiments, the substrate may be a porous anodic aluminum oxide (AAO) substrate. In other embodiments, a porous silicon substrate or any other suitable porous template may be used. The substrate can be macroporous. Also provided herein are arrays comprising two or more of any of the disclosed coaxial nanostructures and devices incorporating any of the disclosed coaxial nanostructures.

In another aspect, methods for making the multiple walled coaxial nanostructures are provided. In one embodiment, the method may include forming a layer of a first material on an inner surface of a nanopore of a nanoporous substrate using atomic layer deposition, forming a first layer of a sacrificial material on the layer of the first material using atomic layer deposition, and forming a layer of a second material on the first layer of the sacrificial material using atomic layer deposition. In another embodiment, the method may further include forming a second layer of a sacrificial material on the layer of the second material and forming a layer of a third material on the second layer of the sacrificial material (until the $n^{th}$ layer in the most general case). The aspect ratio of the coaxial nanostructures provided by such a method may range from about 5 to about 1,200, or about 300 to about 1200, although other aspect ratios are possible. The methods may further include removing the nanoporous template and/or the layers of the sacrificial spacer material by a variety of methods, including by chemical etching. The nanoporous substrates and the compositions of the first material, the second material, the third material, the $n^{th}$ material and the sacrificial spacer material may vary as described above with respect to the multiple walled nested coaxial nanostructures.

In yet another aspect, an electroosmotic pump is provided. In one embodiment, an electroosmotic pump may include a nanoporous membrane having one or more nanopores, a layer of a first material deposited on an inner surface of the nanopore, a first electrode (anode) coupled to a first side of the nanoporous substrate, and a second electrode (cathode) coupled to a second side of the nanoporous template. In another embodiment, the electroosmotic pump may further include a layer of a second material deposited on the layer of the first material. A variety of nanoporous substrates and compositions for the first material, the second material, and the electrodes may be used. Specific examples are provided herein. The performance of the disclosed electroosmotic pumps is superior to conventional pumps.

BRIEF DESCRIPTION OF THE DRAWINGS

FIG. 1A shows the surface of the substrate after ion milling. FIG. 1B shows a cross-section of a cleaved AAO substrate.

FIGS. 11A, 11B, 11C, 11D, 11E, and 11F are a schematic depiction of a process sequence for synthesizing free-standing $HfO_2$ nested coaxial tube-in-tube nanostructures.

FIGS. 13A and 13B provides thermodynamic modeling diagrams showing the distributions of ionic species to represent, for example, the removal of AAO substrate from ZnO nanotubes using NaOH of various pH values.

DETAILED DESCRIPTION

Figure 1A:
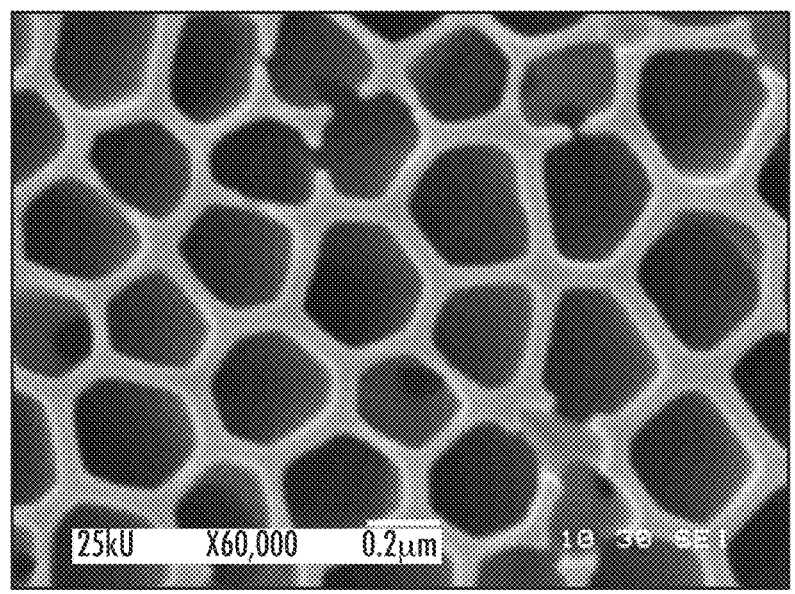
FIGS. 1A and 1B show SEM images of a porous anodic aluminum oxide (AAO) substrate.

Provided herein are multiple walled nested coaxial nanostructures, methods for making the multiple walled nested coaxial nanostructures, and devices incorporating the multiple walled nested coaxial nanostructures.

The multiple walled nested coaxial nanostructures include an inner nanostructure and at least one outer nanotube disposed around the inner nanostructure. The multiple walled nested coaxial nanostructures may include multiple outer nanotubes (up to n outer nanotubes) arranged concentrically around the inner nanostructure. This includes embodiments in which the coaxial nanostructure includes a first outer nanotube disposed around an inner nanostructure, a second outer nanotube disposed around the first outer nanotube, a third outer nanotube disposed around the second outer nanotube, and so forth. In any of these embodiments, the inner nanostructure may also be a nanotube. However, the innermost nanostructure may also be a nanorod.

The multiple walled nested coaxial nanostructures may also include an annular channel between the inner nanostructure and the at least one outer nanotube. For those embodiments having more than one outer nanotube, the coaxial nanostructure may include additional annular channels between the additional outer nanotubes. By way of example only, a multiple walled nested coaxial nanostructure may include a first outer nanotube disposed around an inner nanostructure, a first annular channel between the inner nanostructure and the first outer nanotube, a second outer nanotube disposed around the first outer nanotube, a second annular channel between the first outer nanotube and the second outer nanotube, and so forth. In some embodiments, the annular channel comprises air, after the sacrificial spacer material has been removed from the annular channel. In other embodiments, the annular channel may comprise a sacrificial material. Sacrificial materials are further described below.

The materials used to form the coaxial nanostructures may vary. By way of example only, the inner nanostructure and any of the outer nanotubes may comprise a conductor, an insulator, or a semiconductor. A variety of conductors may be used, including metals or nitrides of metals. Non-limiting examples of metals include Ti, Au, Pt, Al, Cu, Ag, and W. Non-limiting examples of conducting metal nitrides include TiN and TaN and conducting metal oxides include ITO (indium tin oxide) and $RuO_2$. Similarly, a variety of insulators may be used, including metal oxides. Non-limiting examples of insulating oxides and metal oxides include $SiO_2$, $HfO_2$, $ZrO_2$, $Al_2O_3$, $Ta_2O_5$, $La_2O_3$, $Y_2O_3$, $MoO_2$, $In_2O_3$, $V_2O_5$, A variety of semiconductors may also be used, including, but not limited to ZnO, $TiO_2$, $WO_3$, NiO, GaAs, GaP, GaN, InP, InAs, AlAs, and Ge. In some embodiments, the inner nanostructure and any of the outer nanotubes are substantially free of carbon. By "substantially free of carbon," it is meant that the nanostructures do not include, and are not formed of, carbon. However, such nanostructure may include trace amounts of carbon that may be unavoidable due to the methods used to form the nano structures. The structures can be different from and not comprise carbon nanotubes including multi-walled carbon nanotubes, single walled carbon nanotubes, and other types of carbon nanotubes. In still other embodiments, the inner nanostructure and any of the outer nanotubes are completely free of carbon. The inner nanostructure and each of the outer nanotubes may be formed of the same material. Alternatively, the inner nanostructure and each of the outer nanotubes may be each formed of different materials. Finally, some of outer nanotubes and the inner nanostructure may be formed of the same material while others are formed of different materials.

The dimensions of the coaxial nanostructures may also vary. The diameter of the coaxial nanostructures may range from about 50 nm to about 300 nm for alumina templates and at the upper range pore diameters may range as large as several micrometers for porous silicon templates. The pore diameter range that is achievable depends on the material parameters of the porous template material and the electrochemical parameters of the fabrication method used. This includes embodiments in which the diameter is about 60 nm, 75 nm, 90 nm, 125 nm, 150 nm, 175 nm, 200 nm, 250 nm, or 300 nm (including 300 nm for AAO case). The length of the coaxial nanostructures may range from about 15 µm to about 75 µm. This includes embodiments in which the length is about 20 µm, 30 µm, 40 µm, 50 µm, 60 µm, or 70 µm. The aspect ratio (the ratio of the length of the coaxial nanostructure to the diameter of the coaxial nanostructure) may also vary. In some embodiments, the aspect ratio ranges from about 5 to about 1,200, or about 300 to about 1200. This includes embodiments in which the aspect ratio is about 400, 500, 600, 700, 800, 900, or 1000. Finally, the cross-sectional shape of the coaxial nanostructures may vary. In some embodiments, the cross-sectional shape is a polyhedron, such as an octahedron. In other embodiments, the cross-sectional shape is substantially circular. By "substantially circular," it is meant that shape is circular-elliptical, but not necessarily perfectly circular.

Similarly, the dimensions of the outer nanotubes and the inner nanorod or nanotube forming the multiple walled nested coaxial nanostructures may vary, depending upon number of such structures present in the coaxial nanostructure and the overall dimensions of the coaxial nanostructure itself. The width of the walls of the nanotubes and the width of the annular spacer channel (if present) may also vary. In some embodiments, the width ranges from about 5 nm to about 30 nm. This includes embodiments in which the width is about 10 nm, 15 nm, 20 nm, 25 nm and 35 nm.

Multiple walled nested coaxial nanostructures may be coupled to other elements. In some embodiments, the multiple walled nested coaxial nanostructure is coupled to a substrate. A variety of substrates may be used, including any of the metals described above. In some embodiments, the substrate is an Al substrate. In such embodiments, the coaxial nanostructure may be attached to the substrate at one of the ends of the coaxial nanostructure. In other embodiments, the substrate may be a nanoporous substrate and the multiple walled nested coaxial nanostructure may be disposed within a pore of the nanoporous substrate. A variety of nanoporous substrates may be used, including, but not limited to, porous anodic aluminum oxide (AAO) substrates, polycarbonate nanoporous templates (membranes), and porous silicon. Such nanoporous (substrates) templates are known and AAO is commercially available. In still other embodiments, the multiple walled nested coaxial nanostructure may be coupled to both a metal substrate, such as an Al substrate, and a nanoporous substrate, such as an AAO substrate. In such an embodiment, the coaxial nanostructure may be disposed within a pore of the nanoporous substrate and attached to the metal substrate at one of the ends of the coaxial nanostructure.

Regarding AAO substrates, anodic aluminum oxide can be formed by electrochemical oxidation of aluminum in acidic solutions to form regular porous channels, which are parallel to each other. See H. Masuda and K. Fukuda, *Science*, 268, 1466 (1995); V. P. Menon and C. R. Martin, *Anal. Chem.*, 67, 1920 (1995); and M. A. Cameron, I. P. Gartland, J. A. Smith, S. F. Diaz and S. M. George, *Langmuir*, 16, 7435 (2000). The individual pore diameters inside the porous alumina membrane are mainly defined by the anodization voltage. The diameter of the pore depends on the electrolyte nature, its temperature and concentration, the current density and other parameters of the anodization process. Aside from the modulation of the pore diameters by variation of the electrolyte composition and anodization conditions, it is possible to further enlarge the pore diameters by another subsequent selective etching of the porous template walls. The Examples below provide an exemplary method for making a suitable AAO substrate.

Also provided herein are arrays of two or more of any of the coaxial nanostructures described above. The arrays of coaxial nanostructures may be coupled to any of the substrates described above.

Figure 8:
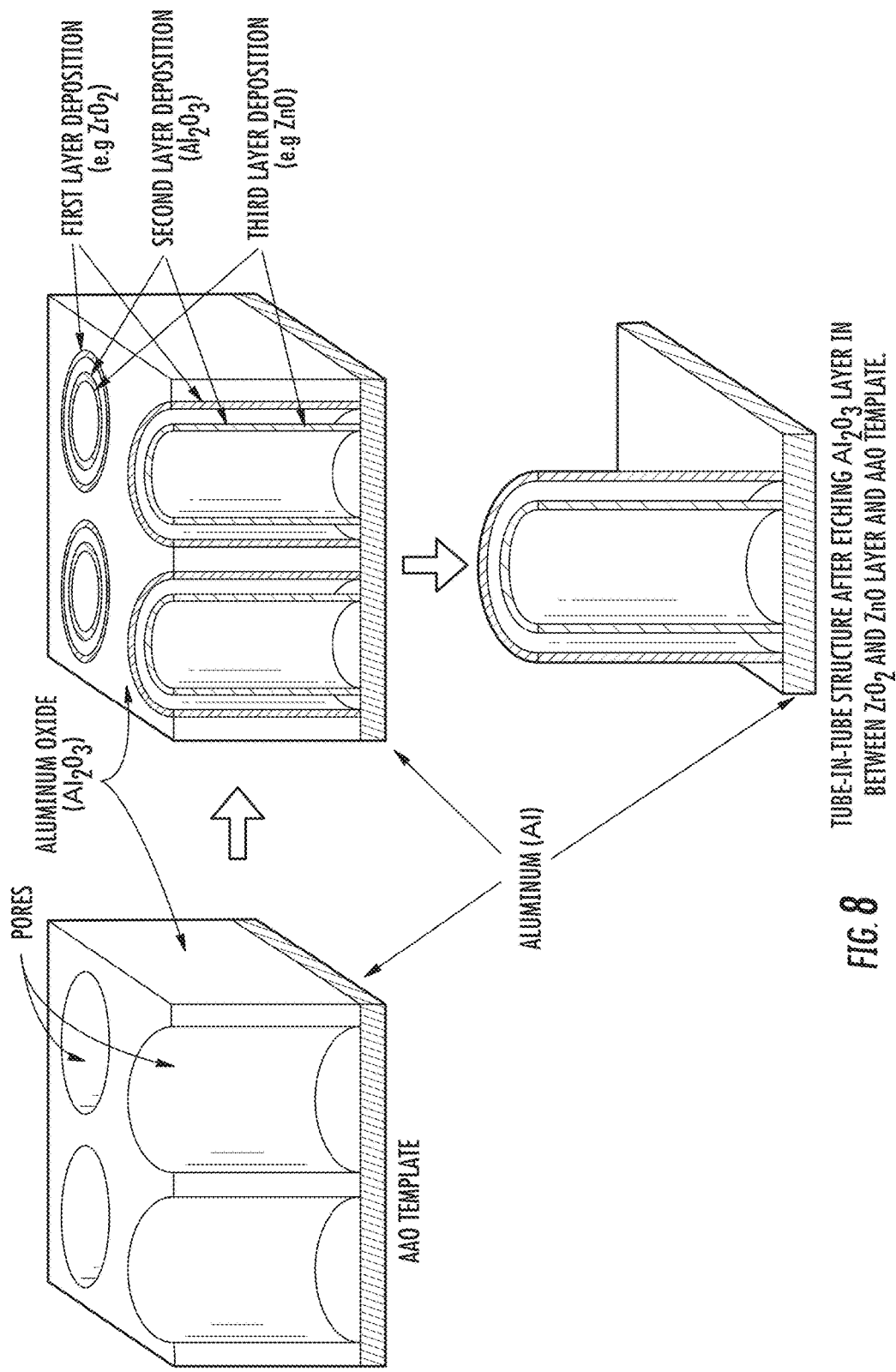
FIG. 8 is an illustration of an exemplary coaxial nanostructure having an inner nanotube of ZnO, a first outer nanotube of $ZrO_2$ disposed around the inner nanotube, and a first annular channel between the inner nanotube and the outer nanotube.

A non-limiting exemplary multiple walled nested coaxial nanostructure is illustrated in FIG. 8. In FIG. 8, a first layer of a metal oxide (e.g., $ZrO_2$) is deposited on the inner surfaces of the nanopores of an AAO substrate. Next, a second layer of a metal oxide (e.g., $Al_2O_3$) is deposited on the first layer of the metal oxide. Next, a third layer of a metal oxide (e.g., ZnO) may be deposited on the second layer of the metal oxide. Finally, both the AAO substrate and the second layer of the metal oxide may be removed by etching to provide a coaxial nanostructure comprising an inner nanotube of ZnO, a first outer nanotube of $ZrO_2$ disposed around the inner nanotube, and a first annular channel between the inner nanotube and the outer nanotube.

Methods

The multiple walled nested coaxial nanostructures described above may be prepared according to the following methods. The methods can use atomic layer deposition or other suitable chemical vapor deposition (CVD) techniques to deposit layers (also referred to as films herein) of the types of materials described above on the inner surface of the nanopores of a nanoporous substrate. ALD is a known technique. Briefly, ALD technology deposits thin films using pulses of chemical precursor gases to adsorb at the target surface one atomic layer at a time. ALD is based on the sequential deposition of individual monolayers or fractions of a monolayer in a controlled fashion. More specifically, in ALD the growth substrate surface is alternately exposed to the vapors of one of two chemical reactants (complementary chemical precursors), which are supplied to the reaction chamber one at a time. The exposure steps are separated by inert gas purge or pump-down steps in order to remove any residual chemical precursor or its by-product before the next chemical precursor can be introduced into the reaction chamber. Thus, ALD involves a repetition of individual growth cycles. See also Ritala, M., "Atomic Layer Deposition", p. 17-64, in Institute of Physics Series in Materials Science and Engineering "High-k Gate Dielectrics" edited by Michel Houssa, Institute of Physics Publishing, Bristol and Philadelphia 2003.; Leskala, M., and Ritala, M., "ALD Precursor Chemistry: Evolution and Future Challenges," *J. Phys.* IV 9, p. 837-852, 1999.

Since a film deposited by ALD is grown in a layer-by-layer fashion and the total film thickness is given by the sum of the number of ALD cycles, it is possible to calculate the number of cycles necessary to reach a desired final film thickness. Conversely the thickness of a film can be set digitally by counting the number of reaction cycles. In general, ALD achieves deposition rates on the order of 0.1-1.0 Å per cycle, with cycle times ranging from one to ten seconds. Due to the self-limiting nature of the surface reactions, accidental overdosing with precursors does not result in increased film deposition. Thus, ALD is able to achieve very precise across-wafer film thickness uniformity, unmatched step coverage and exceptional conformality. Because of the nature of ALD, film thickness is immune to variations caused by non-uniform distribution of reactant vapor or temperature in the reaction chamber. Sec Niinisto, L., Paivasaari, J., Niinisto, J., Putkonen, M., and Mieminen, M., "Advance electronic and optoelectronic materials by Atomic Layer Deposition: An overview with special emphasis on recent progress in processing high-k dielectrics and other oxide materials", *Phys. Stat. Solid.* (a) 201, p. 1443-1452, (2004); and Ritala, M., "Atomic layer deposition," Editors Michel Houssa, High-k Gate Dielectrics, p. 17-64, Publisher Institute of Physics Publishing, Bristol, UK, 2004.

A variety of chemical precursors may be used with ALD, depending upon the desired film. The general requirements and properties of useful chemical precursors are known. See Sneh, O., Clark-Phelps, R. B., Londergan, A. R., Winkler J., and Seidel, T., "Thin film atomic layer deposition equipment for semiconductor processing," *Thin Solid Films*, Vol. 402, Issues 1-2, p. 248-261, 2002 and Leskela, M., and Ritala, M., "Atomic Layer Deposition (ALD): from precursor to thin film structures," *Thin Solid Films*, 409, p. 138-146, 2002. Specific chemical precursors are provided in the Examples below.

In one embodiment of the disclosed methods, the method comprises forming a layer of a first material on an inner surface of a nanopore of a nanoporous substrate using atomic layer deposition and forming a layer of a second material on the layer of the first material using atomic layer deposition. In another embodiment, a layer of a third material may be formed on the layer of the second material, a layer of a fourth material may be formed on the layer of the third material, and so forth. In each of these embodiments, the layer of the first material corresponds to an outer nanotube of the coaxial nanostructures described above. The layer of the second material provides either an additional outer nanotube, or an inner nanostructure, depending upon the number of layers of materials deposited. The first material, second material, and third material may include any of the conductors, insulators, and semiconductors described above. Similarly, any of the nanoporous substrates described above may be used with the disclosed method.

The method may further comprise removing the nanoporous (substrate) template after the multiple walled nested coaxial nanostructure is formed. A variety of methods may be used to remove the nanoporous (substrate) template, including, but not limited to chemical etching. A variety of chemical etchants may be used, depending upon the composition of the nanoporous substrate. By way of example only, when the nanoporous substrate is AAO, NaOH may be used to remove the porous template (substrate).

In another embodiment of the disclosed methods, the method comprises forming a layer of a first material on an inner surface of a nanopore of a nanoporous substrate using atomic layer deposition, forming a first layer of a sacrificial material on the layer of the first material using atomic layer deposition, and forming a layer of a second material on the first layer of the sacrificial material using atomic layer deposition. Other sacrificial spacer layers and layers of additional materials may be deposited. For example, a second layer of a sacrificial spacer material may be formed on the layer of the second material, a layer of a third material may be formed on the second layer of the sacrificial material, and so forth. By "sacrificial spacer material," it is meant a material that is capable of being substantially removed (i.e., removed, but not necessarily completely removed) by a chemical etchant. A non-limiting example of a sacrificial material is $Al_2O_3$, which is capable of being substantially removed by a variety of chemical etchants, including NaOH. However, the sequence of synthesizing the multiple walled nested coaxial nanostructures comprises alternating sacrificial spacer material annular rings with the next nested coaxial nanotube material of choice. As discussed above, the first material, second material, and third material may include any of the conductors, insulators, and semiconductors described above. Similarly, any of the nanoporous templates (substrates) described above may be used with the disclosed method.

In the method involving deposition of a layer or layers of a sacrificial material, the method may further comprise removing any or all of the sacrificial layers by chemical etching. Such a method provides the multiple walled nested coaxial nanostructures having one or more annular channels comprising air, as described above. The method may further comprise removing the nanoporous substrate after the coaxial nanostructure is formed, as described above.

The description of the coaxial nanostructures, AAO substrates, and ALD process make clear that the dimensions of the coaxial nanostructures are both a function of the pore sizes of the AAO substrates as well as the number of cycles and length of each cycle of the ALD process. In order to make the highest aspect ratio coaxial nanostructures for a given AAO substrate, the length of the cycle may be maximized to ensure deposition along the entire length of the nanopore. Long cycle times, however, are contrary to the conventional wisdom that cycle times should be minimized to prevent clogging the pores of the AAO substrates.

Devices and Applications

The multiple walled nested coaxial nanostructures described above may be incorporated into a variety of devices for use in a variety of applications. By way of example only, the multiple walled nested coaxial nanostructures may be used in electroosmotic pumps, chemical sensors, photovoltaic devices, and photonic crystals. The multiple walled nested coaxial nanostructures may also find use as extremely hard and highly durable nanometer-sized pipette tips for various medical applications. Although many of these devices are known, devices incorporating the disclosed coaxial nanostructures are expected to exhibit superior properties over conventional devices due to the high aspect ratio and high surface area of the coaxial nanostructures. These devices are further described below.

Electroosmotic Pumps

Electroosmosis is the motion of ionized liquid relative to a stationary charged surface by an externally applied electric field. Electroosmotic (EO) flows are useful in microfluidic systems, since they enable fluid pumping and flow control without the need for mechanical pumps or valves, and they also minimize the sample dispersion effects. See Karniadakis, G. E., Beskok, A., and Alum., N., *Microflows and Nanoflows: Fundamentals and Simulation*, Springer, New York, 2005. However, conventional EO pumps suffer from a number of drawbacks, including the need for large operating voltages (on the order of 1 kV to 10 kV), electrolysis of water, oxidation of electrode surfaces, and Joule heating. The need for a high voltage supply limits the use of conventional EO pumps in lab-on-a-chip (LoC) type portable devices, designed for bio-medical, pharmaceutical, environmental monitoring and homeland-security applications.

In one embodiment, a two-terminal electroosmotic pump comprises a nanoporous substrate having one or more nanopores and a layer of a first material deposited on an inner surface of the nanopore. The layer of the first material provides a nanotube disposed within the nanopore of the nanoporous substrate. Electrodes may be coupled to both sides of the nanoporous substrate. Any of the nanoporous substrates described above may be used. In some embodiments, the aspect ratio of the nanopores of the nanoporous substrate ranges from about 5 to about 1,200, or about 300 to about 1200. This includes embodiments in which the aspect ratio is about 400, 500, 600, 700, 800, 900, or 1000. The composition of the first material may vary. In some embodiments, the first material comprises a metal oxide or a metal nitride. Any of the metal oxides disclosed above may be used, including, but not limited to $HfO_2$, $ZrO_2$, $Al_2O_3$, ZnO, $TiO_2$, TiN, or $SiO_2$. Similarly, the composition of the electrodes may vary. In some embodiments, the electrodes comprise a metal. Examples of useful metals, include, but are not limited to, Au, Pt, and W. As noted above, the performance of the disclosed two-terminal electroosmotic pump exceeds that of conventional electroosmotic pumps.

In another embodiment, a three-terminal electroosmotic pump comprises a nanoporous substrate having one or more nanopores, a layer of a first material deposited on an inner surface of the nanopore, and a layer of a second material deposited on the layer of the first material. The layer of the first material provides an outer nanotube and the second material provides an inner nanotube, resulting in a coaxial nanostructure disposed within the nanopore of the nanoporous substrate. Electrodes may be coupled to both sides of the nanoporous substrate. Any of the nanoporous substrates described above may be used. In some embodiments, the aspect ratio of the nanopores of the nanoporous substrate ranges from about 5 to about 1,200, or about 300 to about 1200. This includes embodiments in which the aspect ratio is about 400, 500, 600, 700, 800, 900, or 1000.

The composition of the first material, the second material, and the electrodes may vary. In some embodiments, the first material comprises a metal, a metal nitride, or a semiconductor. Non-limiting examples of metals and metal nitrides include Ti, Au, Pt, Al, Cu, Ag, and nitrides thereof. A non-limiting example of a semiconductor includes ZnO. In some embodiments, the second material comprises a metal oxide. Non-limiting examples of oxides and metal oxides include $HfO_2$, $ZrO_2$, $Al_2O_3$, $TiO_2$, and $SiO_2$. Other possible metals, metal nitrides, semiconductors, or metal oxides include, but are not limited to, those described above. In some embodiments, the electrodes comprise a metal. Examples of useful metals, include, but are not limited to, Au, Pt, and W. Similar to the two-terminal electroosmotic pumps described above, the performance of the three-terminal electroosmotic pumps exceeds that of conventional electroosmotic pumps.

The methods for forming these and other electroosmotic pumps is similar to the methods described above, involving the use of atomic layer deposition to deposit the desired number of layers of materials in nanoporous substrates. Methods for depositing electrodes and patterning contacts on the electroosmotic pumps using photolithography or wire bonding techniques are known.

Chemical Sensors

Sensors that are capable of detecting dangerous chemicals and hazardous gases are known. See P. Grundler, *Chemical Sensors: An Introduction for Scientists and Engineers*, Springer (2007). However, conventional sensors often use potentially hazardous radioactive materials and may only be able to detect a single type of chemical. In addition, conventional sensors often have limited capacity and lifetime.

Any of the multiple walled nested coaxial nanostructures described above may be incorporated into a sensor. By way of example only, a sensor may include a coaxial nanostructure having an inner nanotube formed of ZnO and an outer nanotube formed of $ZrO_2$, wherein the inner and outer nanotubes are separated by an annular channel. ZnO is an ideal material for detecting carbon monoxide and $ZrO_2$ is an ideal material for detecting oxygen. Accordingly, such a sensor is capable of detecting multiple chemicals simultaneously. In addition, the "tube-in-tube" or "nested" design increases the reactive surface area by at least four times, thereby providing a sensor with a greater capacity and lifetime than conventional sensors. As outlined above, the nested coaxial nanotube design can be extended to include up to n-times nested detector nanotubes each separated by empty annular spacer channel, where each coaxial nanotube is custom tailored to sense a different chemical. In this fashion, multi-functional broadband sensors and detectors can be prepared.

Photovoltaic cells and Photonic Crystals

Photovoltaic cells and the components used to form the cells are known. See Luque, A., et al., *Handbook of Photovoltaic Science and Engineering*, Wiley (2003). Any of the coaxial nanostructures described above, including the multiple walled nested coaxial nanostructures comprising an annular channel, may be incorporated into a photovoltaic cell and coupled to components such as an anode, cathode, and supporting substrate.

Similarly, photonic crystals and the components used to form the crystals are known. See Lourtioz, J. M., et al., *Photonic Crystals: Towards Nanoscale Photonic Devices*, Springer (2008). Any of the coaxial nanostructures described above, including the multiple walled nested coaxial nanostructures comprising an annular channel, may be incorporated into a photonic crystals and coupled to various components such as a supporting metal substrate. Two-dimensional photonic crystals may be formed from coaxial nanostructures having an outer nanotube disposed around an inner nanotube, wherein the nanotubes are separated by an annular channel. Three-dimensional photonic crystals may be similarly formed, using a nanoporous substrate having branched channels connecting the main nanopores.

Figure 9:
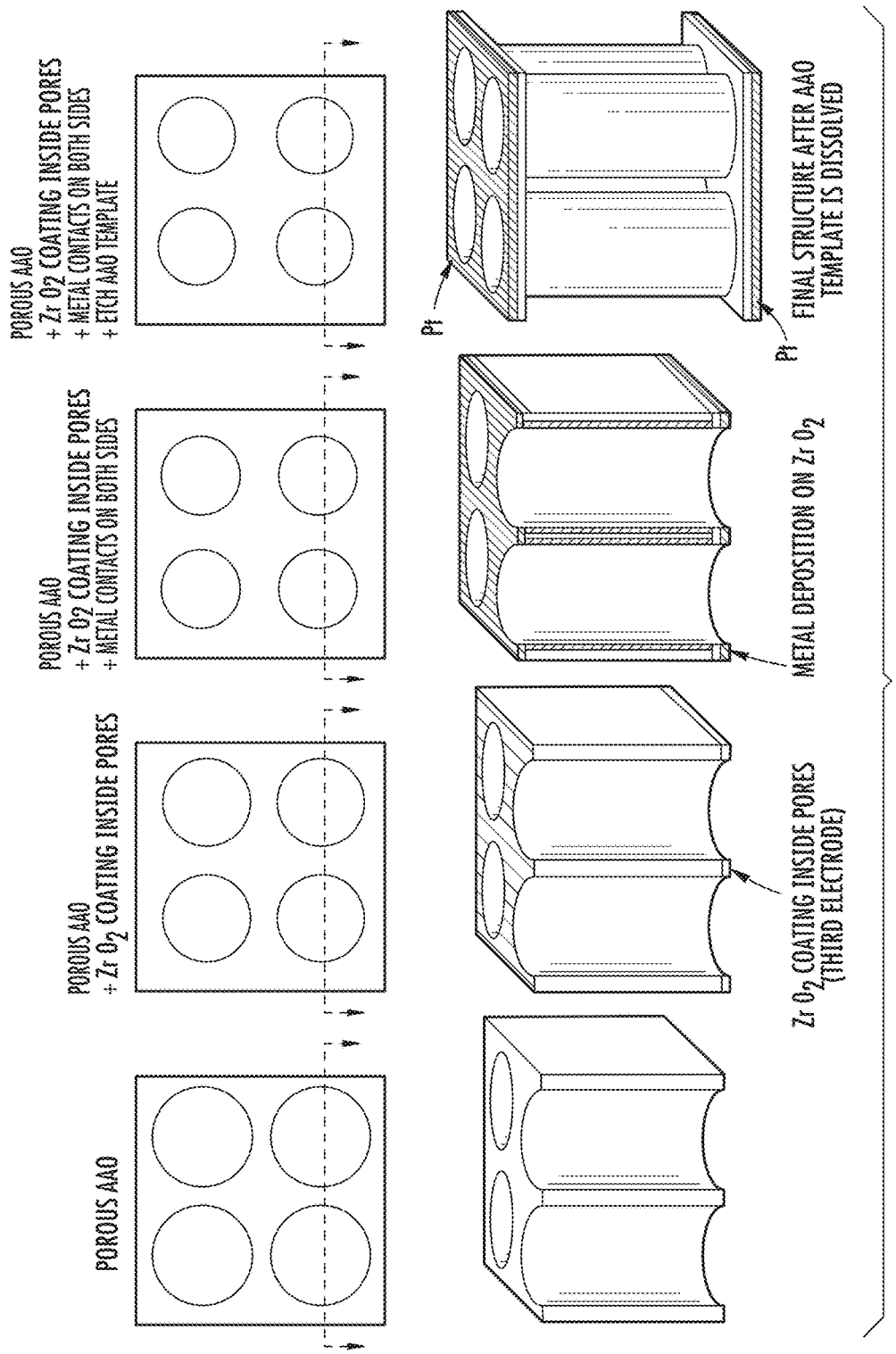
FIG. 9 is an illustration of an exemplary structure that may be used to provide a chemical sensor.

Non-limiting exemplary devices are illustrated in FIG. 9. In FIG. 9, a layer of a metal oxide (e.g., $ZrO_2$) is deposited on the inner surfaces of the nanopores of an AAO substrate. Next, a layer of a metal (e.g., Pt) is deposited on the top surface and the bottom surface of the AAO substrate. Finally, the AAO substrate may be dissolved by chemical etching. The structure shown may be used as an oxygen sensor.

Additional embodiments and descriptions may be found in co-pending application Ser. No. 13/264,427 filed on Apr. 23, 2010 ("Electroosmotic Pump"; Baumgart et al.), and in a publication to Gu, et al, "Synthesis of Nested Coaxial Multiple-Walled Nanotubes by Atomic Layer Deposition," ACS Nano, Vol. 4 No. 2, 753-758, 2010, both of which are hereby incorporated by reference in their entireties.

Other Embodiments

Figure 10C:
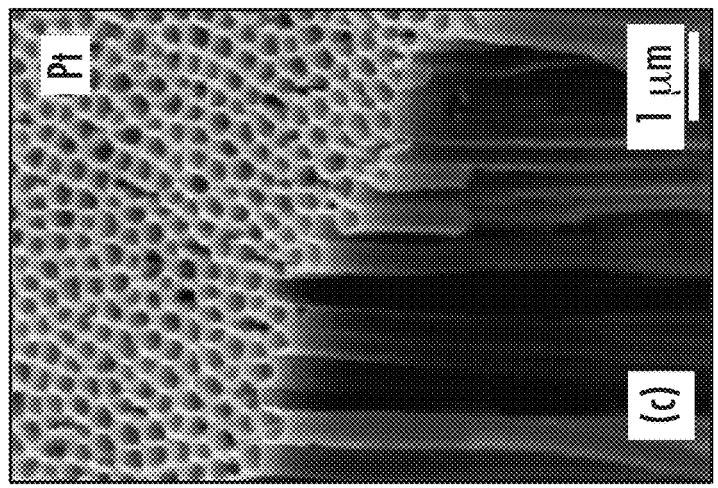
FIGS. 10A, 10B, 10C are an SEM image of free-standing single walled nanotubes.
Figure 10B:
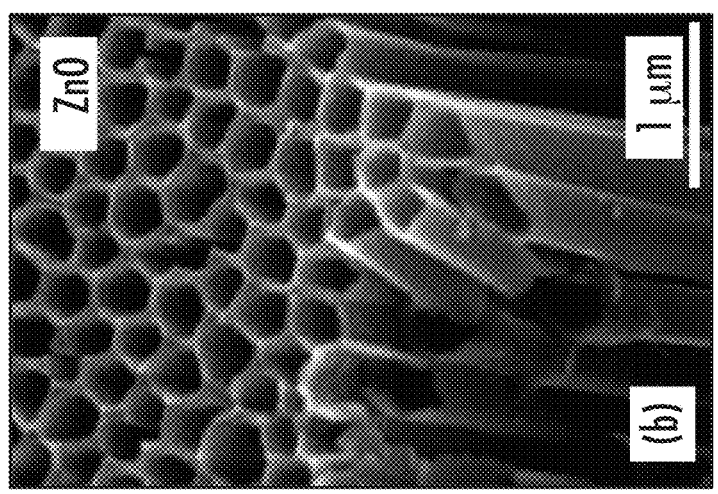
Figure 10A:
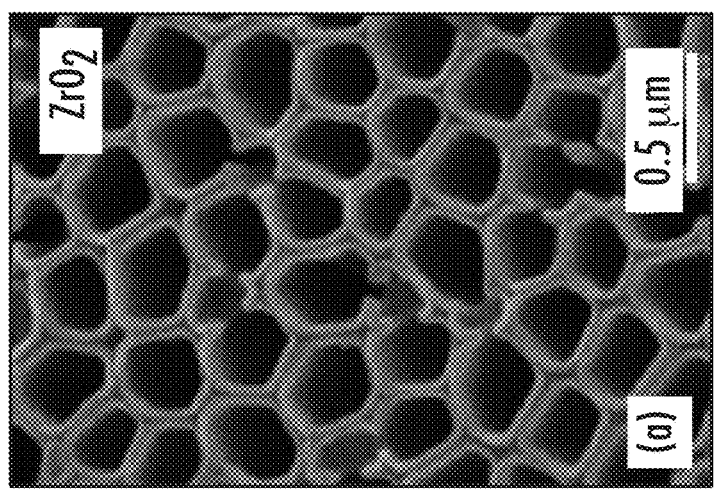

Additional embodiments of the present invention include single-walled nanotubes of insulating, semiconducting and metallic materials. For example, insulating material may be high-k $ZrO_2$, semiconducting material may be ZnO and metallic material may be Pt. FIG. 10A shows an SEM micrograph of partially released, single-walled, and ALD synthesized nanotubes of insulating high-k ZrO2. FIG. 10B shows SEM views of cleaved samples of partially released, single-walled, and ALD synthesized nanotubes of semiconductor ZnO. FIG. 10C shows SEM views of cleaved samples of partially released, single walled, and ALD synthesized metallic Pt nanotubes obtained by dissolving an alumina template in an NaOH solution.

In other embodiments, a sensor capable of simultaneously detecting a plurality of chemicals comprises any of the coaxial nanostructures described herein. For example, in an additional embodiment, a sensor based on multiple walled nested nanotubes, such as a multiple walled nanotube comprising an inner nanostructure, at least one of an outer nanotube disposed around the inner nanostructure, and a first annular channel between the inner nanostructure and the at least one first outer nanotube, is capable of detecting several different chemicals, for example several different hazardous or dangerous gases. In this embodiment, each of the at least one of an outer nanotubes may comprise a material capable of targeting specific chemical compounds. The at least one outer nanotube may be a plurality of nanotubes, wherein each subsequent nanotube is disposed around the previous nanotube, and an annular channel is formed between each of the plurality of nanotubes. In this embodiment, each of the nanotubes is capable of targeting one or more chemical compounds, and may be capable of targeting the same or different chemical compound as subsequent nanotubes. Accordingly, a sensor having broadband sensing capabilities can be engineered by substituting a specific sensor material for one of the multiple tubes.

Other embodiments of multi-layered tube-in-tube nanostructures described herein may be used in applications including sensors and detectors, MEMS, nano-capacitors, photonic crystals, Microfluidic electroosmotic pumps for drug delivery and general medical applications and photovoltaic devices. Additional embodiments include the use of the methods described herein in applications such as commercial fabrication and assembly of extremely hard and durable $ZnO_2$ nanometer pipette tips for medical research needed for injecting chemicals from aqueous solutions into cancer cells, or for fertilization of egg cells in reproductive medicine.

Non-limiting exemplary methods of forming nested coaxial tube-in-tube nanostructures are illustrated in FIG. 11. In FIG. 11A a nanoporous AAO substrate is formed. FIG. 11B shows a subsequent step of using ALD to coat the inner pore walls of the AAO substrate of FIG. 11A with $HfO_2$. An ALD deposition of a sacrificial spacer layer consisting of, for example, $Al_2O_3$ over the $HfO_2$ layer is shown FIG. 11C. Next, as shown in FIG. 11D, using an ALD process, a second layer $HfO_2$ is coated on the sacrificial spacer layer and AAO template walls. FIG. 11E shows an ion milling sputter removal step of the ALD composite layers from surfaces of the AAO template in order to expose the sacrificial spacer layer and the AAO template walls. FIG. 11F shows a step of releasing and separating formed coaxial $HfO_2$ nanotubes by chemical dissolution of the alumina AAO template walls and the sacrificial ALD $Al_2O_3$ spacer layers using an Aqueous NaOH solution.

Figure 12B:
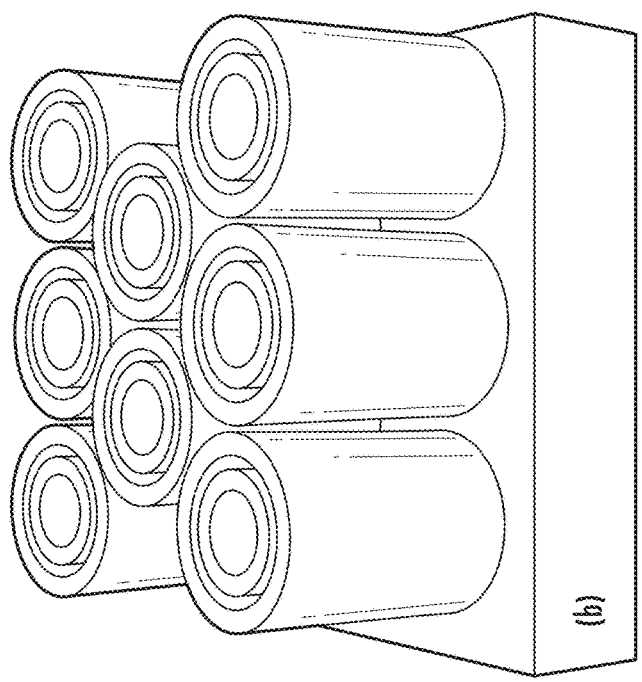
FIGS. 12A and 12B shows coaxial $HfO_2$ nanotubes formed by, for example, the method depicted in FIGS. 11A-11F.
Figure 12A:
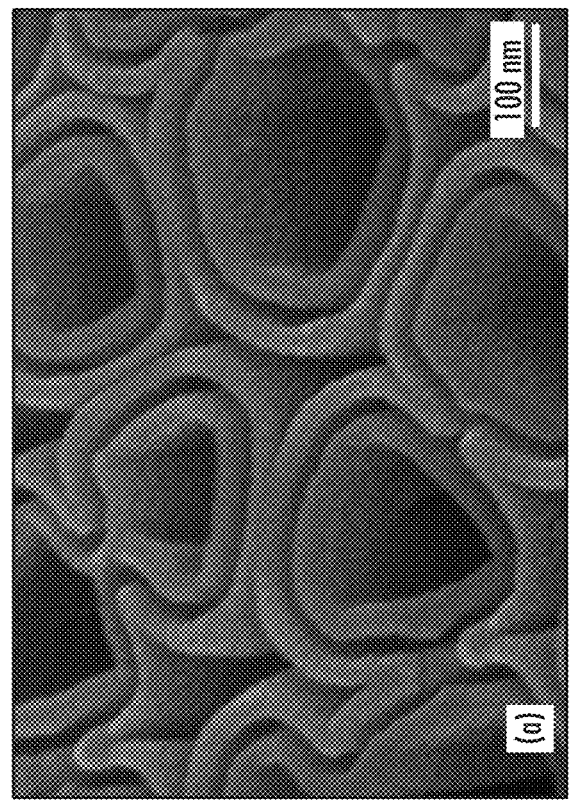

FIG. 12A is a high-magnification tilted SEM top view of resultant coaxial $HfO_2$ nanotubes following release from an AAO template and after removing a sacrificial spacer $Al_2O_3$ layer as in the method of FIG. 11. FIG. 12B is a schematic model depicting an array of free standing coaxial nested nanotubes.

While NaOH solution may be used to dissolve the AAO template, as discussed above, the dissolution process may be predetermined depending on the various deposited and sacrificial layers, and the type of material of the nanotubes. For example, various process parameters and etch chemistry characteristics determine the release characteristics of ALD ZnO nanotubes from AAO templates. FIG. 13A represents a thermodynamic model showing the distributions of the fraction of all $Al^{3+}$ species at different pH values calculated at 298K for 0.001 mM $Al^{3+}$ solution. In FIG. 13A, the formation of solid alumina is in the pH range of 4.2 to 9.8 and the maximum solubility of $Al_2O_3$ is at pH below 4.2 and above pH 9.8. FIG. 13B represents a thermodynamic model showing the distributions of the fraction of all $Zn^{2+}$ species at different pH values calculated at 298 K for 0.001 mM $Zn^{2+}$ solution. In FIG. 13B, the thermodynamic modeling of $Zn^{2+}$ species indicates that zinc always has soluble species at any pH value, the existence of crystalline ZnO is in the pH range of 9.2 to 11.5 and the maximum solubility of crystalline ZnO is at pH below 9.2 and above pH 11.5. Thus, an NaOH solution at pH 13 partially eteches and degrades a ZnO surface. In embodiments described herein, an NaOH solution in the range of pH 10.3-11.0, for example a pH of 11.0 may be used to successfully remove AAO.

Figure 14:
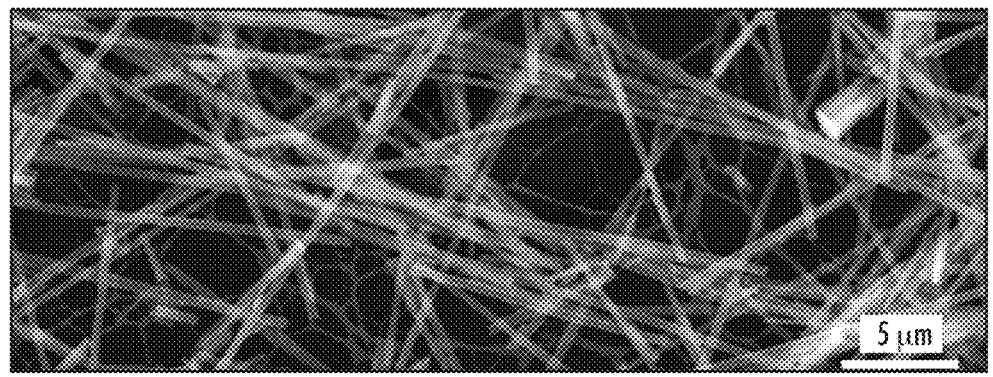
FIG. 14 is an SEM micrograph showing large numbers of high aspect ratio coaxial ALD $HfO_2$.

Upon further removal of a template structure, for example, an AAO template the free-standing coaxial nanotubes may be released from the template as shown in FIG. 14. For many practical applications, the embedded nanotubes have to be released in order to collect and incorporate them into device structures. Certain applications call for attached upright standing coaxial nanotubes, while other application require completely chemically released and detached coaxial nanotubes. Large numbers of completely detached and individual nanotubes of the present embodiments can be harvested by, for example, sonication in an aqueous solution. Such nanotubes may be completely detached and may have high aspect ratios of about 5 or above, or about 300 and above.

Figure 5:
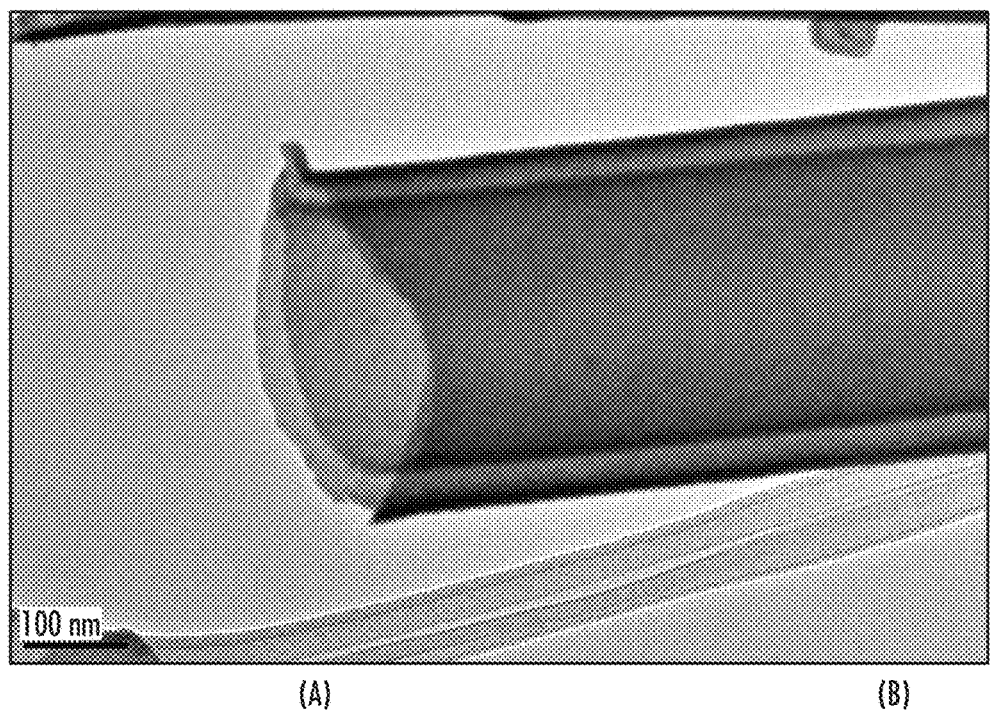
FIG. 5 is a TEM micrograph of a separated $HfO_2$ tube-in-tube coaxial nanostructure shown in FIG. 4.
Figure 15:
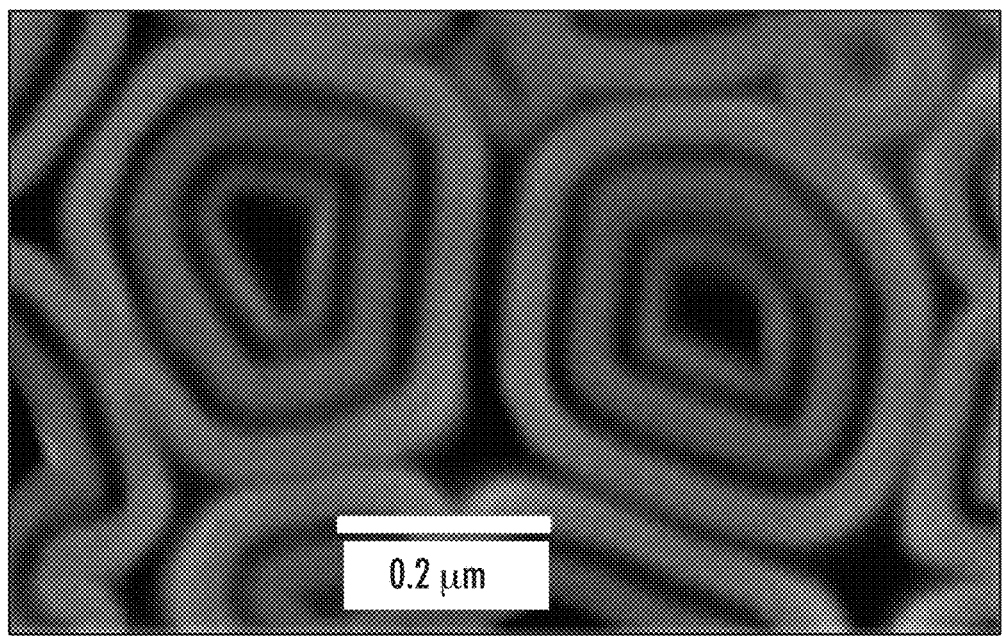
FIG. 15 is a top-down SEM image showing five nested coaxial ALD layers such as nested nanotube structures.

FIGS. 5, and 15 show that the annular channel between the nested coaxial nanotubes provides sufficient space to continue a process of growing additional nanotubes by ALD. For example, a synthesis and assembly of nested multiple tube-in-tube nano structures can be extended to n-layers, where n is more than one. For example, as shown in FIG. 15, a total number of five nested coaxial nanotube structures may be provided. Upon reducing the thickness of the nanotube walls, by varying ALD growth parameters, the number of nested nanotubes may be increased. The structures shown in FIG. 15 consist of triple coaxial $HfO_2$ nanotubes separated by a gap and two sacrificial ALD $Al_2O_3$ spacers layers. Additional description is provided with use of the following non-limiting examples.

EXAMPLES

The following examples made use of an ALD reactor from Cambridge Nanotech, Model Savannah 100.

Example 1

Formation of a Nanoporous AAO Substrate

The nanoporous AAO substrate was prepared by a two-step anodization procedure. High purity aluminum sheets (0.5 mm thick) were degreased in acetone. The Al sheets were then electropolished in a solution of $HClO_4$ and ethanol (1:4, v/v) at 20 V for 5-10 min or until a mirror like surface was achieved. The first anodization step was carried out in a 0.3 M oxalic acid solution electrolyte under a constant direct current (DC) voltage of 80 V at 17° C. for 24 h. The porous alumina layer was then stripped away from the Al substrate by etching the sample in a solution containing 6 wt % phosphoric acid and 1.8 wt % chromic acid at 60° C. for 12 h. The second anodization step was carried out in a 0.3 M oxalic acid solution under a constant direct current (DC) voltage of 80 V at 17° C. for 24 h. The AAO substrates with highly ordered arrays of nanopores were then obtained by selectively etching away the unreacted Al in a saturated $HgCl_2$ solution.

Figure 1B:
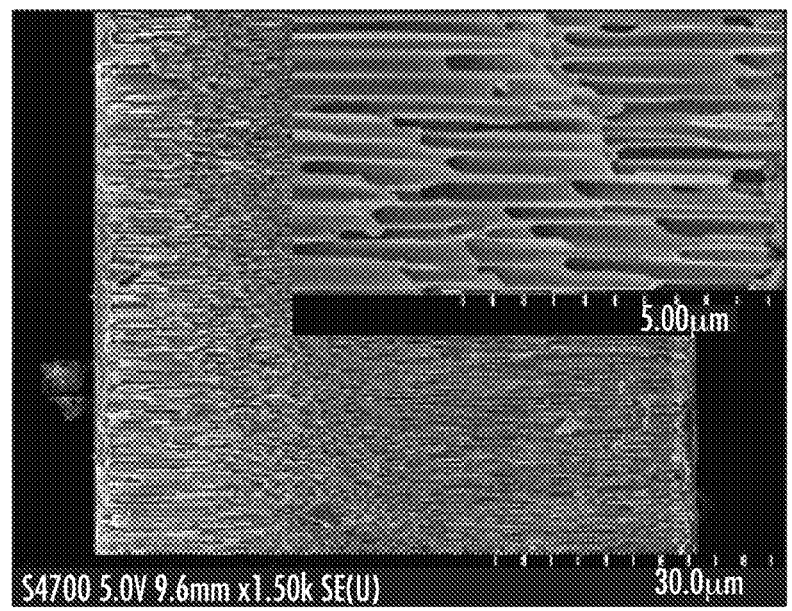

FIG. 1A shows the SEM image of the pore structure of the AAO after the surface was planarized by ion milling. The pore size is in the range of 200-300 nm and the wall width between pores is around 50 nm. Some of the pores were connected through thinning of the wall. The cross-sectional SEM image shown in FIG. 1B reveals that the pores are all parallel to each other and across the whole substrate of 60 µm thickness. The inset to FIG. 1B shows the formation of branches in some of the pores. These branches may be eliminated with shorter anodization times, which results in a shorter pore length. A closer view of tube opening showed that the side connected to the cathode has smaller pore size, to a depth of a few micrometers. This thin layer can be removed by etching to achieve uniform pore diameter across the entire substrate depth. High magnification FE-SEM of a cleavage sample highlights the microstructure of partially split open nanopores of AAO. The smooth morphology of the inside walls of the AAO nanopores can be clearly seen. Excellent surface finish of the inner pore walls of the template is useful for obtaining highly ordered tube-in-tube nanostructures, since the ALD thin film coating technique replicates the surface finish on an Angstrom scale.

Example 2

Formation of $HfO_2$, $ZrO_2$, and ZnO Nanotubes

The AAO substrates were subsequently transferred to the ALD chamber for $ZrO_2$, $HfO_2$ and ZnO coating of the inside surfaces of the nanopores. The $ZrO_2$ and $HfO_2$ deposition was performed at 250° C. using water vapor as the oxidant and tetrakis (dimethylamido) hafnium (IV) and tetrakis (dimethylamido) zirconium (IV) as the precursor, respectively. The deposition rate is about 1 Å/cycle at this temperature. ZnO was grown with diethyl zinc (DEZ) as precursor and water vapor as oxidation source. The optimum ALD process window for ZnO was determined to be in the temperature range between 110° C. and 160° C.

Due to the extremely high (60 µm) depth of the nanopores and the diffusivity of the chemical precursors, the entire nanopores may not be coated uniformly unless an extended ALD cycle time is used. For AAO pores coated with 20 nm $HfO_2$, cross sectional energy dispersive spectroscopy (EDS) mapping demonstrated that Hf signal was detected up to a depth of about 15 µm from the sample surface without any added ALD exposure time. For AAO pores coated with 20 nm $ZrO_2$, the surface pore diameter was reduced after $ZrO_2$ deposition, indicating that $ZrO_2$ was also deposited on AAO template. Increased ALD exposure times were used for the Zr precursor to reach saturation of precursor species on the inside walls of the pores and ensure uniform coating along the length of the pores.

Figure 2A:
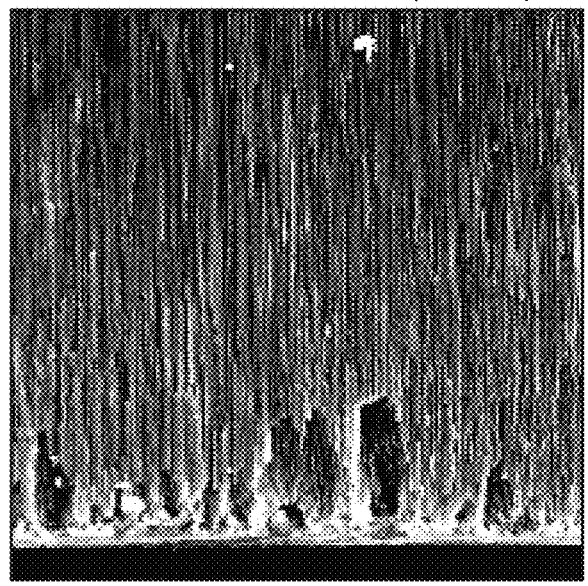
FIGS. 2A and 2B shows a cross-sectional SEM image of ALD (atomic layer deposited) zirconia coated AAO substrate (FIG. 2A) and a corresponding EDS Zr mapping showing uniform distribution of zirconia throughout the entire thickness of the 60 μm AAO substrate (FIG. 2B).
Figure 2B:
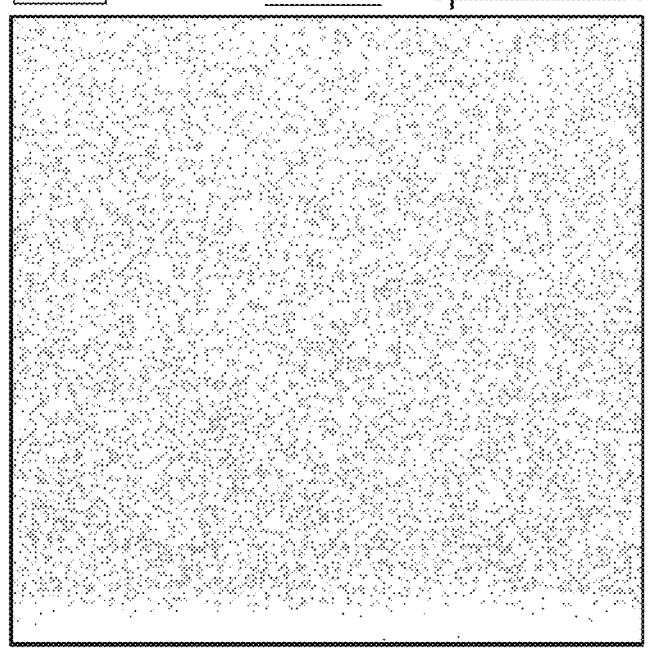

FIGS. 2A and 2B show the cross-sectional SEM image and EDS mapping of the AAO substrate coated with 20 nm $ZrO_2$ using 30 s additional ALD exposure time. It can be observed that there is still a gradient in the Zr signal following the length of the metal oxide the nanotubes. This is because the AAO substrate was placed in the ALD chamber flat on one side so that access of the Zr precursor to the backside opening was blocked. The uniformity of coating can be improved by lifting the AAO substrate so that the precursor can access both sizes of the pore opening during ALD deposition.

Figure 3A:
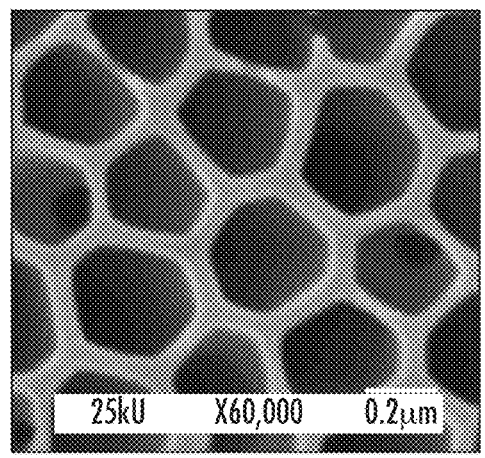
FIGS. 3A, 3B, and 3C shows a top-down SEM image of an uncoated AAO substrate (FIG. 3A); the same AAO substrate with a thin film ALD coating of $ZrO_2$ (FIG. 3B); and the same coated AAO substrate after the alumina substrate walls have been removed to provide single $ZrO_2$ nanotubes (FIG. 3C).
Figure 3B:
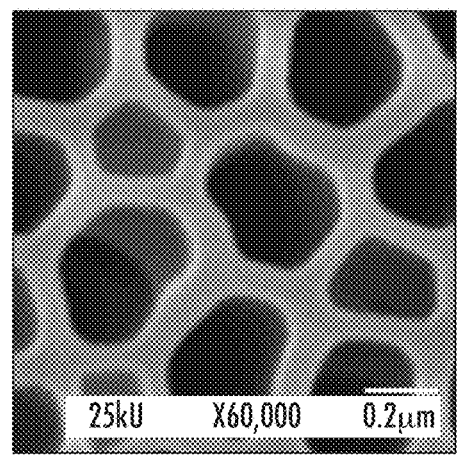
Figure 3C:
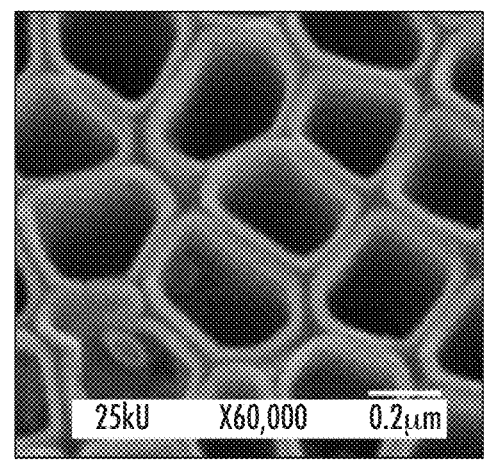

FIGS. 3A and 3B show an AAO substrate before being coated with $ZrO_2$ (A) and after being coated with 20 nm $ZrO_2$ (B). A comparison of the figures shows that the pore size has been reduced because the wall thickness has been increased by growing a $ZrO_2$ film. In order to fabricate free-standing $ZrO_2$ nanotubes (i.e., nanotubes unsupported along their lengths by the AAO substrate), the alumina walls between the pores were dissolved by a 6M NaOH solution. The porous AAO surface was first cleared of its $ZrO_2$ films by ion milling to expose the AAO wall to the etchant. FIG. 3C shows the free-standing $ZrO_2$ nanotubes after ion milling and chemical dissolution of alumina walls. The SEM image clearly shows the empty trenches in place of the former alumina side walls. The dimensions of the nanotubes are dependent upon the thickness and pore diameter of the AAO substrate and the ALD deposition time. Smaller tubes or even rods can be fabricated using this method by using AAO substrates with smaller pores. Different materials can still be deposited inside of the nanotubes depending on the application.

Example 3

Formation of a $HfO_2$ Tube-in-Tube Coaxial Nanostructure

Figure 4:
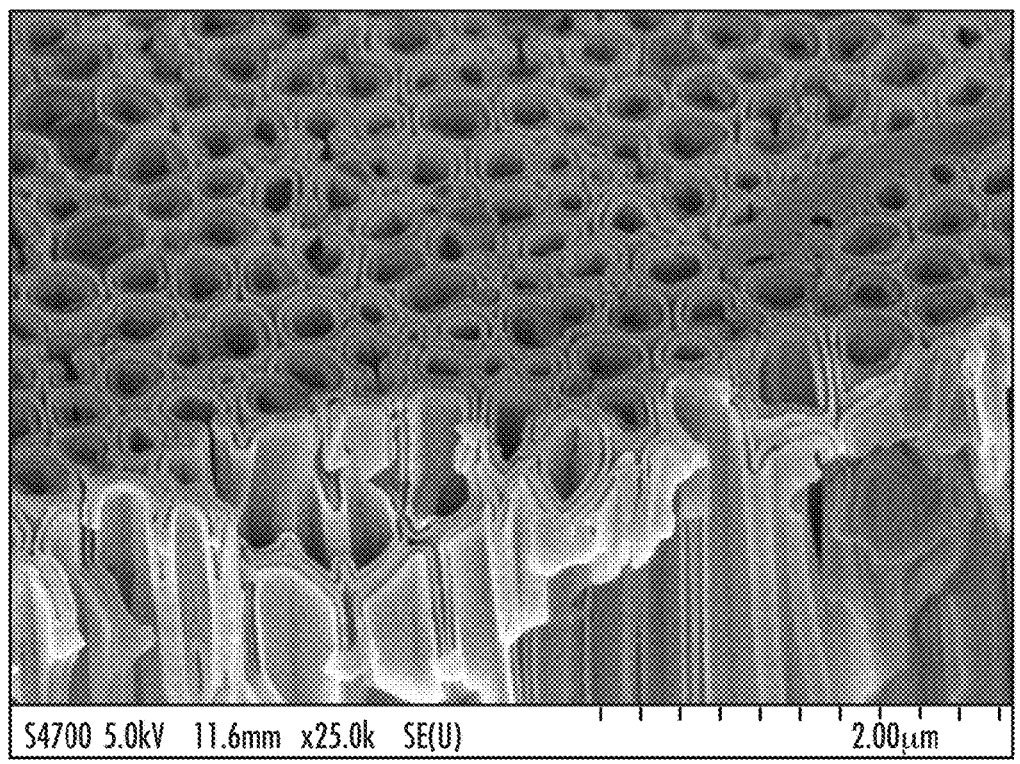
FIG. 4 shows a SEM micrograph of $HfO_2$ tube-in-tube coaxial nanostructures. A top-down view of the sample surface and a partial side-view from a cleavage site is shown by tilting the sample.

In this example, a second nanotube having a smaller dimension was deposited inside of the aforementioned $HfO_2$ nanotubes. To fabricate this tube-in-tube structure, two layers of 10 nm $HfO_2$ films were deposited inside of the AAO pores and separated by 25 nm of a layer of $Al_2O_3$, which was deposited by ALD at 300° C. using $[Al(CH_3)_3]$ (TMA) and water vapor as the aluminum and oxygen source, respectively. $Al_2O_3$ is the same material as the AAO substrate and can be easily etched away. Following the three layer coating, the sample surface was again polished by ion milling and then dipped into NaOH solution to etch both the AAO substrate and $Al_2O_3$ layer between $HfO_2$ layers. FIG. 4 shows a double-walled $HfO_2$ tube-in-tube structure after wet etching in NaOH solution. The $HfO_2$ tube thicknesses are very uniform from both the top and cross section. The expected wall thicknesses for both tubes are 10 nm, as determined from the number of ALD cycles. However, the $HfO_2$ tubes look much thicker from the SEM image due to the gold coating for charging release.

Transmission electron microscopy (TEM) was used to examine the $HfO_2$ tube-in-tube structure and tube wall thickness using the following processing sequence. After NaOH etching the $HfO_2$ nanotubes were suspended in isopropanol solution and separated by sonicating. The $HfO_2$ nanotubes in isopropanol were subsequently poured onto the TEM copper grid. FIG. 5 shows TEM high magnification micrographs of double-walled $HfO_2$ tube-in-tube structure. The tube-in-tube structure shown in FIG. 5 was achieved even from AAO pores with branches or dead ends. FIG. 5 also reveals that upon release of the nanotubes from the AAO template (substrates), the coaxial nanostructures have undergone a shape transformation from an irregular octahedral shaped cross-section (compare FIGS. 3 and 4) to a circular cross-section. Since this shape transformation takes place at room temperature during the chemical release of the coaxial nanostructures, temperature activated diffusion processes are ruled out. This spontaneous snap-back upon release from the template of otherwise very hard ceramics like $ZrO_2$ and $HfO_2$ into the energetically most favorable circular shape is clearly a nanotechnology phenomenon. This snap-back process of shape transformation cannot occur at macroscopic sizes of the same hard ceramic materials. Coaxial nanostructures having circular cross-sections are desirable for pipette tips for various medical applications.

Example 4

Formation of a $ZrO_2$ Tube-in-Tube-in-Tube Coaxial Nanostructure

Figure 6:
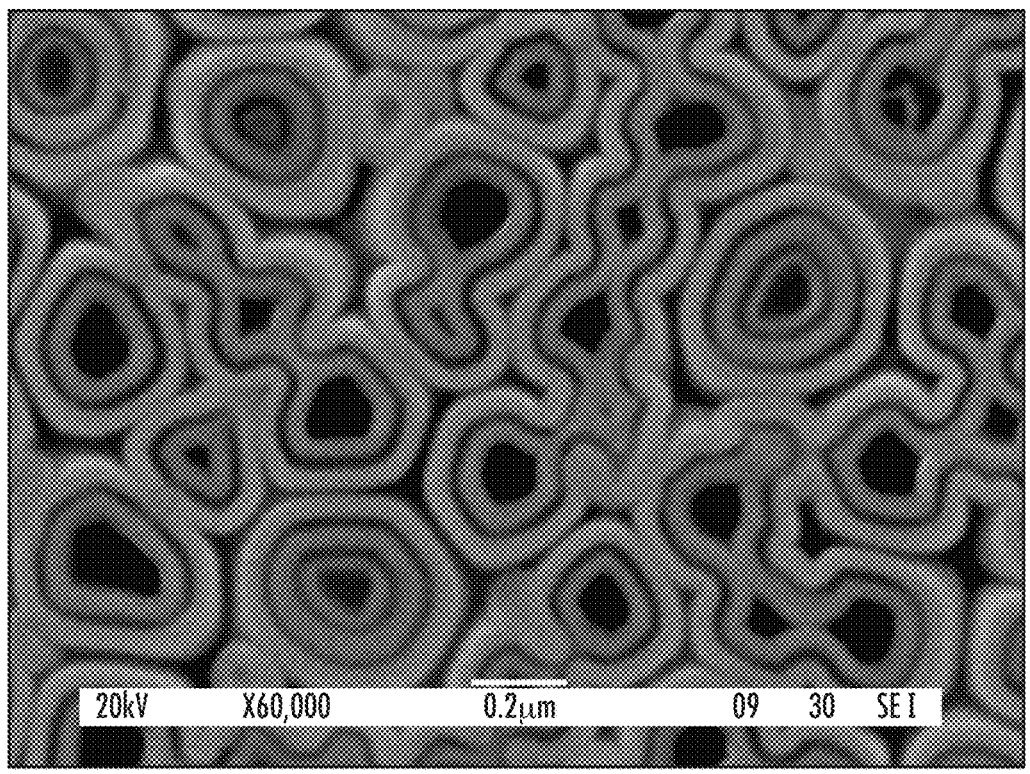
FIG. 6 is a top-down SEM image showing three concentric metal oxide ($ZrO_2$) nanotubes inside large AAO pores following the dissolution of the 2 separating spacer $Al_2O_3$ layers in order to expose the sidewalls of the coaxial ($ZrO_2$) nanotubes. These five coaxial nanostructures were formed by layering $ZrO_2/Al_2O_3/ZrO_2/Al_2O_3/ZrO_2$ and removing the $Al_2O_3$ layers by chemical etching.

The method of Example 3 was modified to provide two nanotubes having a smaller dimension deposited inside of the aforementioned $ZrO_2$ nanotubes. Three layers of $ZrO_2$ films were deposited inside of AAO pores, separated by a layer of $Al_2O_3$. The $Al_2O_3$ layers were removed as described above. The resulting tube-in-tube-in-tube coaxial nanostructure is shown in FIG. 6.

Example 5

Formation of $HfO_2/ZrO_2$ Coaxial Nanostructure

Figure 7:
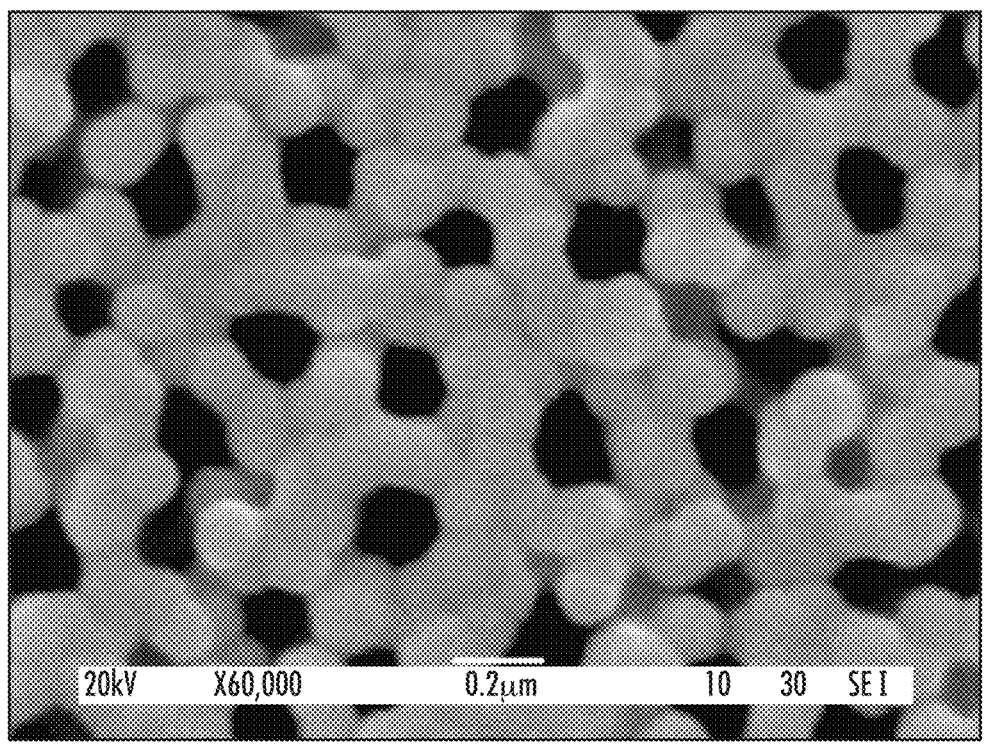
FIG. 7 is a top-down SEM image of hafnia/zirconia coaxial nanostructures disposed in the nanopores of a AAO substrate showing the simultaneous coating of the AAO surface and the inner walls of the nanopores.

ALD was used to deposit a layer of $HfO_2$ inside the nanopore of an AAO substrate followed by a layer of $ZrO_2$ on the layer of $HfO_2$ to provide a double-walled coaxial nanostructure. FIG. 7 shows the surface morphology and tube size after the two layer coating.

In addition, the AAO substrate is transferred to an ALD reaction chamber in order to grow nested multiple-walled nanotubes within the AAO pores. Pt may be used for metal nanotubes and ZnO and $TiO_2$ may be used for semiconducting metal oxide nanotubes. As insulating materials, the transition metal oxides of $ZrO_2$, $HfO_2$, and $Al_2O_3$ may be used. ALD is a thin film growth technique that requires the sequential exposure of the sample to two chemical precursors to saturate the sample surface and to react with each other. The technical details of the ALD process conditions and the different chemical precursors and deposition parameters utilized for all of th nested nanotubes investigated in this study are listed in Table 1 below.

Following the ALD deposition of the aforementioned materials, the AAO sample surfaces may be polished by ion milling to expose the template surface and the ALD grown alumina spacer to the NaOH solution. A 1 M NaOH solution is used to etch alumina for all ALD nanotube materials except for ZnO nanotubes. For the case of ZnO, 0.1 M NaOH is used to achieve etching of the alumina template while minimizing the etch attack of the ZnO nanotubes. It is also essential to perform a post-ALD deposition annealing procedure for ZnO nanotubes at 600° C. for 10 min in air, in order to obtain high quality smooth surface morphologies of the ZnO nanotubes.

TABLE 1

| Materials | Deposition Temp. | Precursor I | Precursor II | Growth Rate (Angstrom/cycle) |
|---|---|---|---|---|
| $ZrO_2$ | 250 | tetrakis(dimethyl-amido)zirconium | $H_2O$ Vapor | 1 |
| ZnO | 150 | diethyl zinc | $H_2O$ Vapor | 2.3 |
| Pt | 300 | (trimethyl)methylcyclopentadienyl platinum | oxygen | 0.5 |
| $TiO_2$ | 250 | titanium isopropoxide | $H_2O$ Vapor | 0.3-0.4 |
| $HfO_2$ | 250 | tetrakis(dimethyl-amido)hafnium | $H_2O$ Vapor | 1 |
| $Al_2O_3$ | 300 | trimethylaluminmum | $H_2O$ Vapor | 1 |

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above.

All publications, patent applications, issued patents, and other documents referred to in this specification are herein incorporated by reference as if each individual publication, patent application, issued patent, or other document were specifically and individually indicated to be incorporated by reference in its entirety. Definitions that are contained in text incorporated by reference are excluded to the extent that they contradict definitions in this disclosure.

For the purposes of this disclosure and unless otherwise specified, "a" or "an" means "one or more."

What is claimed is:

1. A method of making a coaxial nanostructure comprising:
    forming a layer of a first material on an inner surface of a nanopore of a nanoporous substrate using atomic layer deposition;
    forming a first layer of a sacrificial material on the layer of the first material using atomic layer deposition; and
    forming a layer of a second material on the first layer of the sacrificial material using atomic layer deposition,
    wherein the coaxial nanostructure is defined by the layer of first material and the layer of the second material formed in the nanopore and has an aspect ratio ranging from about 300 to about 1200.

2. The method of claim 1, wherein the nanoporous substrate is anodic aluminum oxide.

3. The method of claim 1, wherein the sacrificial material comprises $Al_2O_3$.

4. The method of claim 1, wherein the first material, the second material, or both comprise a conductor.

5. The method of claim 1, wherein the first material, the second material, or both comprise an insulator.

6. The method of claim 1, wherein the first material, the second material, or both comprise a semiconductor.

7. The method of claim 1, wherein the first material and the second material independently comprise a metal oxide selected from ZnO, SiO$_2$, HfO$_2$, ZrO$_2$, or TiO$_2$.

8. The method of claim 1, further comprising removing the sacrificial layer by chemical etching.

9. The method of claim 1, further comprising removing the nanoporous substrate.

10. The method of claim 1, further comprising removing the nanoporous substrate by chemical etching.

11. The method of claim 1, further comprising forming a second layer of a sacrificial material on the layer of the second material and forming a layer of a third material on the second layer of the sacrificial material.

12. A method of making a coaxial nanostructure comprising:
   forming a layer of a first material on an inner surface of a nanopore of a nanoporous substrate using atomic layer deposition;
   forming a first layer of a sacrificial material on the layer of the first material using atomic layer deposition; and
   forming a layer of a second material on the first layer of the sacrificial material using atomic layer deposition,
   wherein coaxial nanostructure is defined by the layer of first material and the layer of the second material formed in the nanopore and has an aspect ratio ranging from about 5 to about 1200.

13. A method of making a coaxial nanostructure comprising:
   forming a layer of a first material on an inner surface of a nanopore of a nanoporous substrate or a macroporous substrate using atomic layer deposition;
   forming a first layer of a sacrificial material on the layer of the first material using atomic layer deposition; and
   forming a layer of a second material on the first layer of the sacrificial material using atomic layer deposition,
   wherein the coaxial nanostructure is defined by the layer of first material and the layer of the second material formed in the nanopore and has an aspect ratio ranging from about 5 to about 1200.

14. The method of claim 13, wherein the macroporous substrate is used.

15. The method of claim 13, wherein the substrate is silicon.

* * * * *